United States Patent [19]

Saunders et al.

[11] 4,054,353
[45] Oct. 18, 1977

[54] ELECTRICAL EQUIPMENT UNIT

[75] Inventors: Laurie A. Saunders, Fleet; Robert W. Donnelly, Basingstoke, both of England

[73] Assignee: International Telephone and Telegraph Industries, New York, N.Y.

[21] Appl. No.: 652,189

[22] Filed: Jan. 26, 1976

Related U.S. Application Data

[63] Continuation of Ser. No. 509,135, Sept. 25, 1974, abandoned.

[51] Int. Cl.² .............................................. H01R 9/12
[52] U.S. Cl. .......................................... 339/176 MF
[58] Field of Search ............ 339/17 F, 17 L, 176 MF, 339/95 R

[56] References Cited
U.S. PATENT DOCUMENTS

| | | | |
|---|---|---|---|
| 3,114,587 | 12/1963 | Herrmann | 339/17 F X |
| 3,307,139 | 2/1967 | Prise | 339/176 MF |
| 3,325,769 | 6/1967 | Travis | 339/176 MF |
| 3,609,462 | 9/1971 | De Barros | 339/17 L X |
| 3,614,707 | 10/1971 | Kaufmann et al. | 339/176 MF X |
| 3,727,168 | 4/1973 | Henchen et al. | 339/17 F |
| 3,753,207 | 8/1973 | Maheux et al. | 339/176 MF X |
| 3,819,989 | 6/1974 | Braune | 339/17 F X |
| 3,820,053 | 6/1974 | Champion et al. | 339/17 F |
| 3,853,382 | 12/1974 | Lazar | 339/95 R |

*Primary Examiner*—Gerald A. Dost
*Assistant Examiner*—Howard N. Goldberg
*Attorney, Agent, or Firm*—Thomas L. Peterson

[57] ABSTRACT

An electrical equipment unit useful for automobiles. The unit includes a box-like case that contains one or more flexible printed circuits. Part of the flexible printed circuit is rigidized to form part of the structure of the unit. The rigidized part is fitted into the case. Electrical components are supported on the rigidized part of the flexible circuit.

6 Claims, 17 Drawing Figures

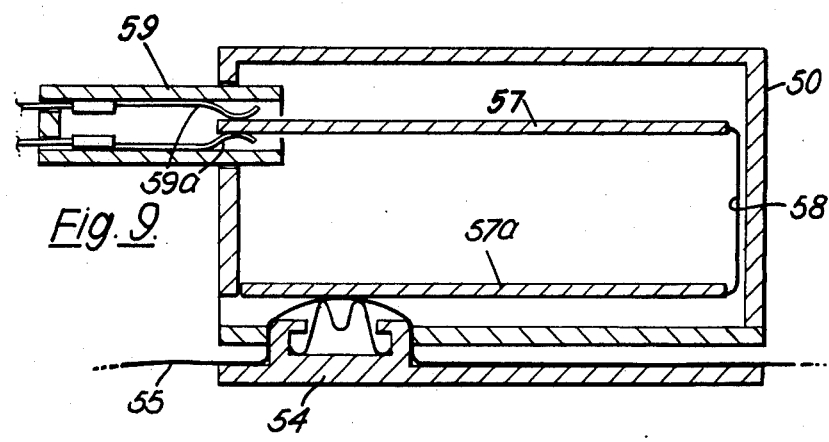
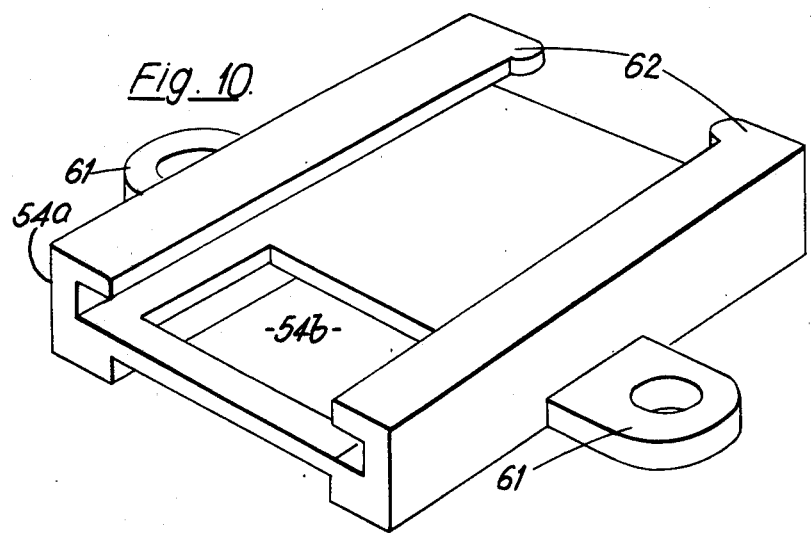
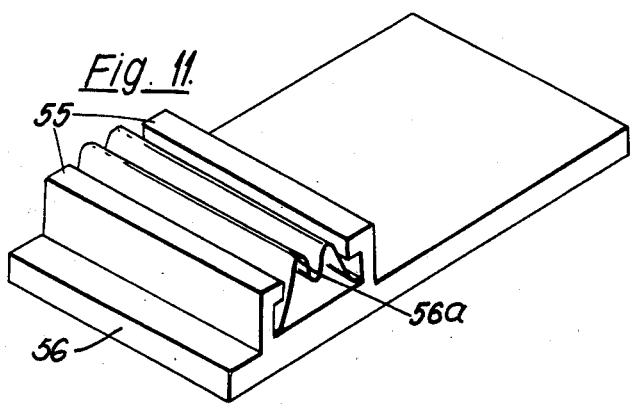

4,054,353

ELECTRICAL EQUIPMENT UNIT

This is a continuation of application Ser. No. 509,135, filed Sept. 25, 1974, now abandoned.

BACKGROUND OF THE INVENTION

This invention relates generally to an electrical equipment unit and, more particularly, to equipment which may be included in a control system suitable for use in road vehicles.

The invention described herein may be utilized, for example, in a time division multiplex control system for use, for instance, in a road vehicle. However, the equipment unit according to the invention has wider applications.

SUMMARY OF THE INVENTION

According to the principal aspect of the present invention there is provided an electrical equipment unit which includes a box-like case that contains one or more flexible printed circuits. The box-like case may be the transmitter or receiver used in the system referred to above. At least part of the flexible printed circuit is rigidized to form part of the structure of the unit. The rigidized part is fitted into the case. Electrical components may be supported on the rigidized part of the flexible circuit within the case.

BRIEF DESCRIPTION OF THE DRAWINGS

FIG. 9 is a vertical sectional view through the transmitter illustrated in FIG. 8 with the various parts thereof assembled;

FIGS. 10 and 11 illustrate the two parts of the flexible circuit supporting base utilized in the transmitter illustrated in FIGS. 8 and 9;

DESCRIPTION OF THE PREFERRED EMBODIMENTS

Figure 1:
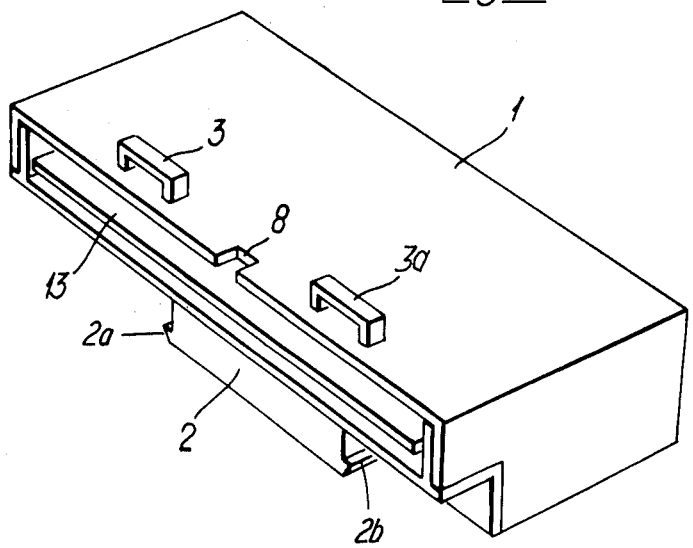
FIG. 1 is a perspective view of one embodiment of the transmitter of the present invention.

Referring to FIGS. 1-4 of the drawings in detail, there is shown a transmitter having an equipment case 1 with a projection 2 on one side. Snap-in ears 2a,2b are formed on the sides of the case so that it can be fitted to a suitable hole in, for instance, a car's dashboard (not shown). On the upper surface of the case as viewed in FIG. 1 there are two ears 3, 3a which cooperate with lugs 5, 6 on a round wire-flexible circuit connector 4 illustrated in FIG. 3. Between the ears on the case 1 and the lugs on the connector 4 there are a polarizing stud 7 and a notch 8, respectively.

Figure 2:
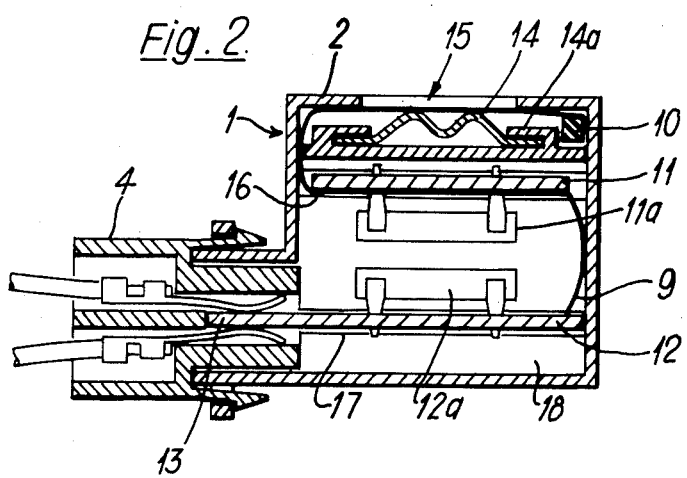
FIG. 2 is a vertical sectional view through the transmitter illustrated in FIG. 1, shown inverted as compared to FIG. 1, and having a connector attached thereto.
Figure 3:
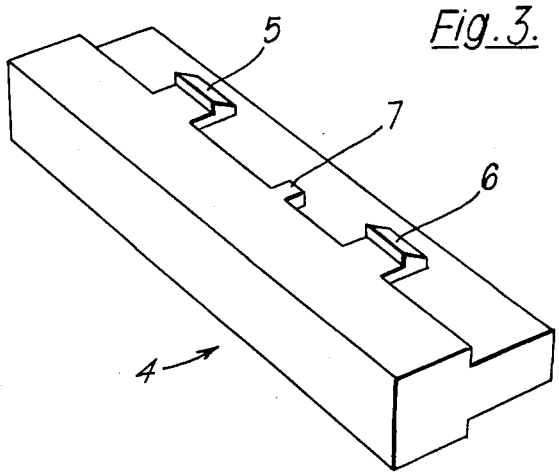
FIG. 3 is a perspective view of the connector illustrated in FIG. 2.

FIG. 2 shows how the connector 4 is fitted to the case 1, which is inverted as compared with FIG. 1. The projection 2 is hollow, and it contains a flexible printed circuit 9 which has an end portion 10 that is rigidized to locate it in the case 1 and two further rigidized portions 11 and 12 which act as support for electrical components 11a and 12a, respectively. These portions 9, 11 and 12 are each integral with the flexible printed circuit in the example shown, e.g. by having additional layers of insulating material deposited on them. The edge 13 of the rigid portion 12, which is also visible in FIG. 1, acts as a male element to cooperate with the connector 4 shown at the left-hand side of FIG. 2. Below the circuit 9, i.e. above it as viewed in FIG. 2, there is a W-shaped spring 14 mounted in a fixed support 14a. The spring urges a portion of the flexible circuit toward a hole 15, via which connection is made to power and other circuits.

The components 11a, 12a carried by the rigidized portions 11 and 12, and indeed any other components mounted in the case 1 depend on the nature of the transmitter circuit. These two rigidized portions are board-like in their structure, and are received in grooves 16, 17 on the inside of opposed walls 18 of the case 1, only one such wall being visible in FIG. 2.

Figure 4:
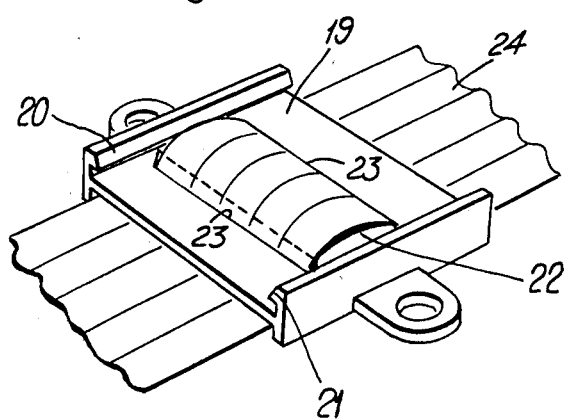
FIG. 4 is a perspective view of a second connector adapted to be attached to the transmitter illustrated in FIG. 2.

The power and other circuits are connected via the connector device shown in FIG. 4. This device comprises a frame 19 with snap-on ears 20, 21 so that it can be snapped into the hole 15 in the case 1. This frame has a raised curved portion 22 with slots 23 along its two edges through which a flexible circuit 24 is inserted as shown. The flexible circuit has the insulation removed from its upper surface, and the circuit 9, FIG. 2, has the insulation removed from its outer surface. Thus when the frame in FIG. 4 is snap-fitted to the case portion 2, the flexible cable 24 is urged against the flexible circuit 9, so that the conductive tracks in the two make electrical contact, with the spring 14 providing contact pressure.

In the car application referred to previously herein, the switches on the dashboard are connected to the transmitter via the connector 4 and the power supply and the leads to the receivers are connected thereto via the frame 19.

Figure 5:
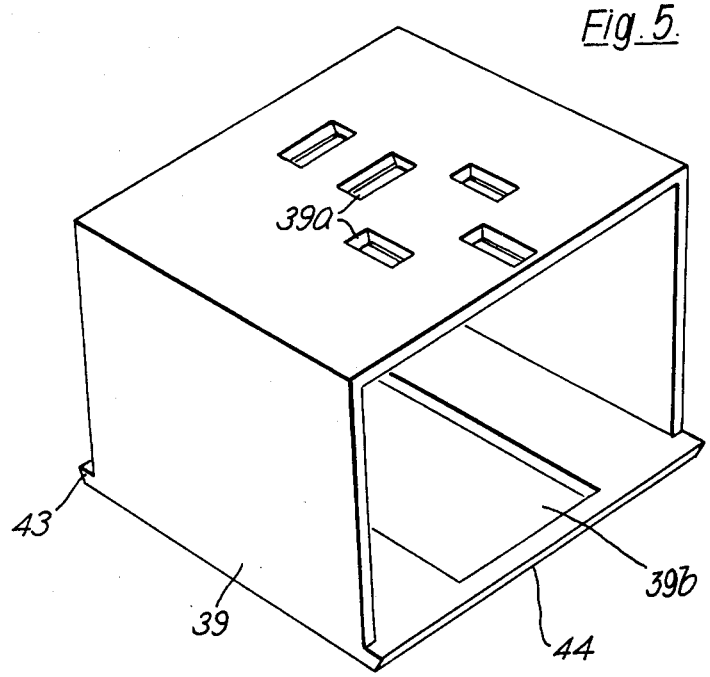
FIG. 5 is a perspective view of a case utilized in one embodiment of the receiver of the invention.
Figure 7:
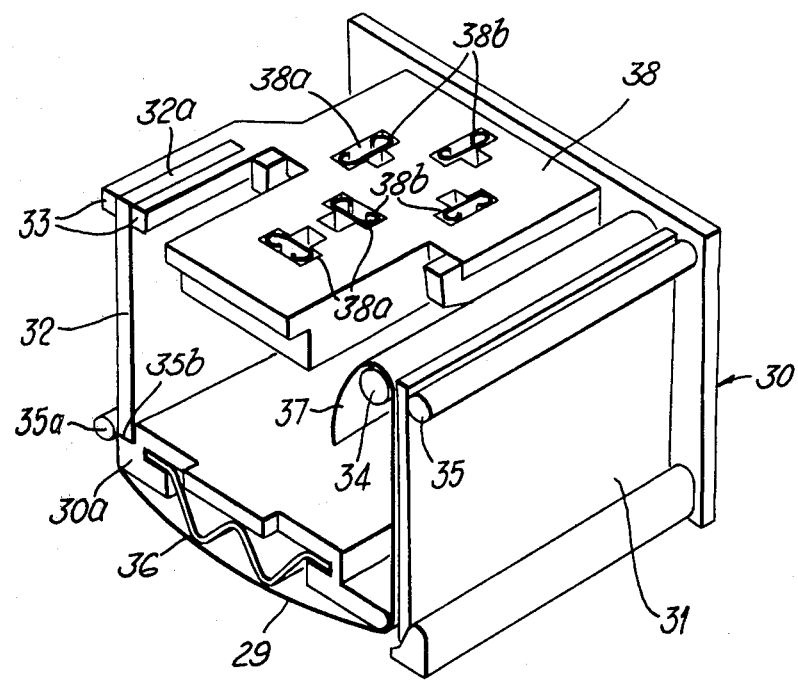
FIG. 7 is a perspective view of a circuit carrier adapted to be mounted within the case illustrated in FIG. 5.
Figure 8:
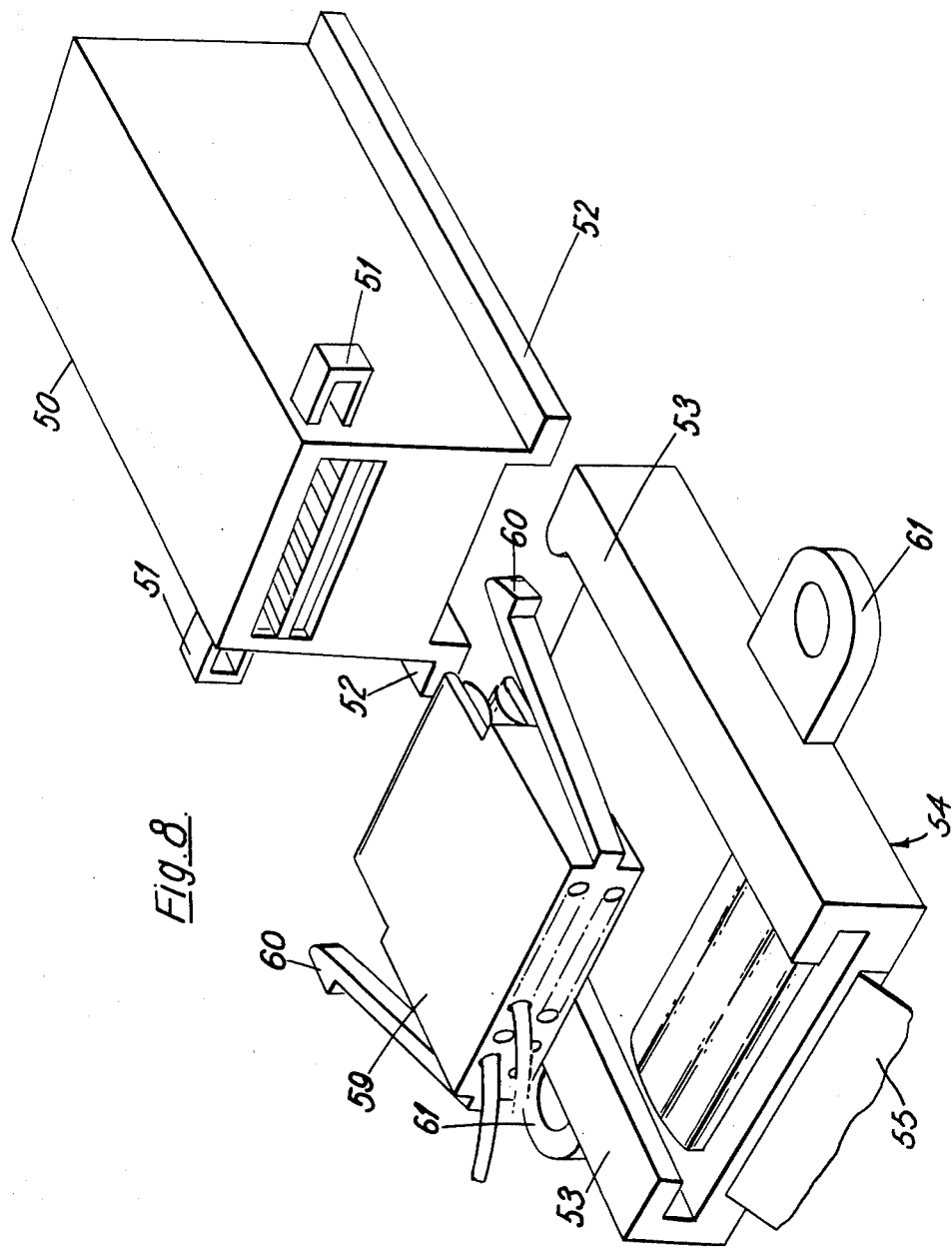
FIG. 8 is a perspective exploded view of a second form of a transmitter in accordance with the invention.

Reference is now made to the receiver shown in FIGS. 5 and 7. A flexible printed circuit 29 is fitted to a carrier 30 shown in FIG. 7. The circuit 29 has rigidized portions 31 and 32 which are integral with the rest of the circuit, and act as supports for electrical components, not shown. The rigid supports 32 and 31, respectively are retained in the carrier by the forked portion 33 and rod-like portions 34, 35. The rigidized portion 32 has an extension 32a at its uppermost end which fits snugly between the legs of the fork 33. The legs are resiliently biased inwardly to firmly grip the extension 32a of the portion 32. At its lower edge the portion 32 is received in a step-like edge 35b of the carrier's base plate 30a, with a retaining rod 35a engaging on the outside of the portion 32. At the right-hand side of the carrier 30 the upper end of the rigidized portion 31 is received between the two fixed rods 34, 35. Below the lower face of the carrier there is a W-shaped spring 36 which, like the spring 14 in FIG. 2, urges the flexible (i.e. non-rigidized) portion of the flexible circuit 29 outwardly to provide contact pressure.

The carrier has a plate-like portion 38 with sockets 38a containing contacts 38b for engagement with the contacts of at least one plug-in relay (not shown) which repeats the control functions to the controlled devices (e.g. headlamps in the case of a car). Connections to the contacts 38b of the relay base thus provided come from the portion 32 of the flexible circuit, e.g. via wires (not shown) crimped to the socket contacts. At the end of the circuit 29 there is a portion 37, called a coding area, in which the circuit tracks are suitably defined, e.g. by punching portions out, to prepare the circuit for response to a particular signal.

Figure 6:
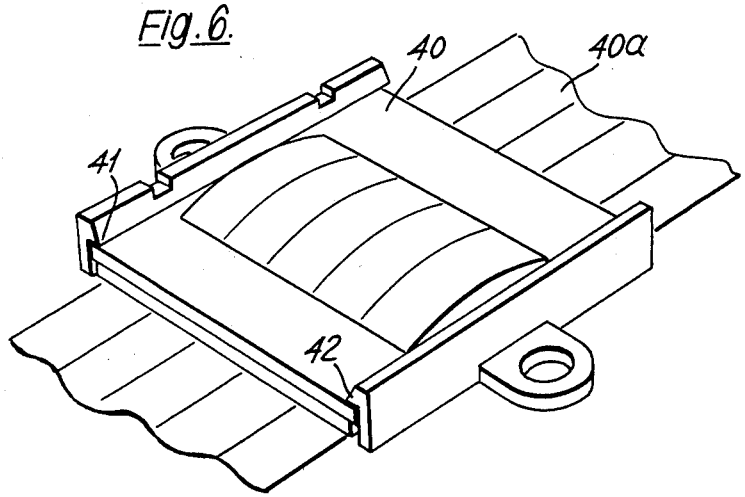
FIG. 6 is a perspective view of a connector adapted to be attached to the case illustrated in FIG. 5.

When the circuit 29 is installed in the carrier 30 and all terminations with contacts 38b of the relay base 38 are made, the carrier is placed in the case 39 shown in FIG. 5, with its socket contacts 38b aligned with holes such as 39a, and the spring-urged section of the circuit 29 aligned with a further hole 39b. The power and signal circuits (from the transmitter shown in FIGS. 1–4) are connected via a frame 40 seen in FIG. 6, which is like the frame 19 of FIG. 4. The frame 40 carries a flexible printed circuit 40a and is snap-fitted into the hole 39b by ears 41, 42 similar to those on the frame 19. The unit is then sealed, e.g. by ultrasonic welding or adhesives, and proofed against environmental conditions by grommets, sleeves, boots, etc. Note the ears 43, 44 on the box 39 used to snap-fit the receiver unit into a hole in the car or other structure (not shown).

FIGS. 8–11 show another construction of a transmitter, which comprises a box 50 with ears 51 on its sides and feet 52 along the lower edges of the sides. These feet slide into grooves defined by lips 53 on a two-part base 54 which supports a flexible cable 55 in a similar manner to FIG. 4. The construction of the two-part base is shown in FIGS. 10 and 11. The upper part 54a has a hole 54b which receives two upstanding portions 55 on the lower part 56. These two portions are bent over as shown to support a W-shaped spring 56a which, when the base parts 54a, 56 are fitted together urges the flexible cable upwards. When the base 54 and the box 50 are assembled together, as seen in FIG. 9, the flexible cable 55, parts of the conductive tracks of which are bared, is pressed upwards against a rigidized portion 57a of a flexible circuit 58. The circuit 58 includes a second rigidized portion 57.

Connections to the transmitter box 50 enter via an edge connector 59, which has hooked arms 60 for cooperation with the ears 51. This edge connector is shown in section in FIG. 9, and its contacts 59a cooperate with bared tracks along the edges of the rigidized portion 57.

The base 54 has perforated fixing tags 61. When the transmitter is assembled as shown in FIG. 9 the whole assembly is held in place on the car by the tags 61.

Finally, the base has nose pieces 62 which snap behind the box 50 when the latter is fitted to the base.

Figure 12:
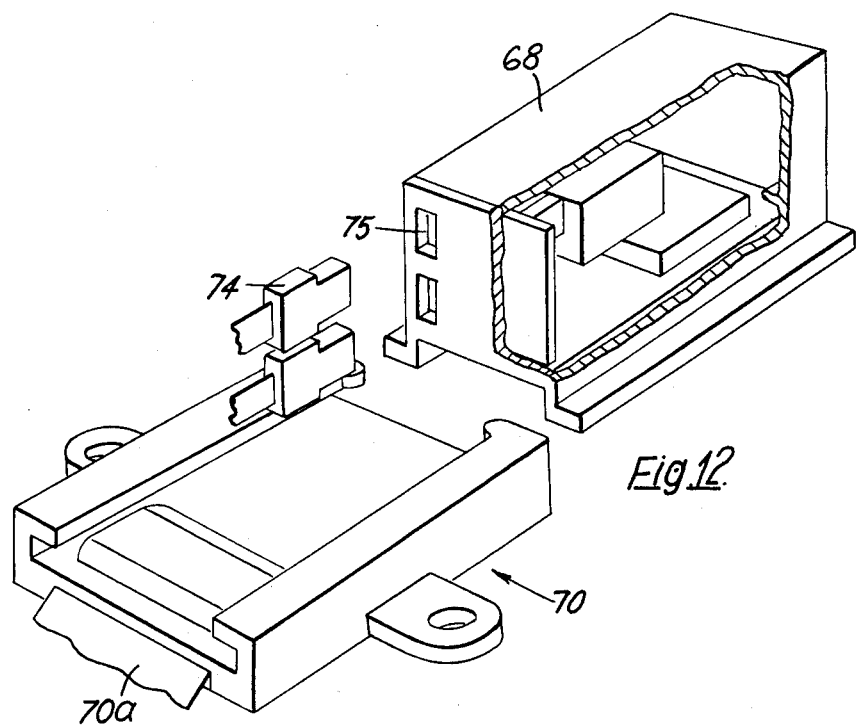
FIG. 12 is a perspective exploded view of a second form of a receiver in accordance with the invention.
Figure 13:
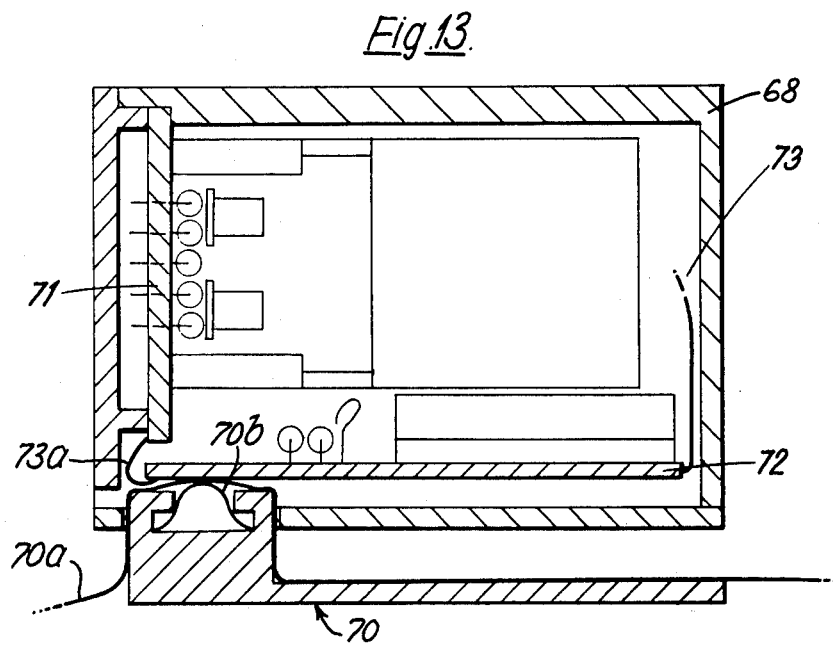
FIG. 13 is a vertical sectional view through the receiver illustrated in FIG. 12 with the various parts thereof assembled.

The receiver unit shown in FIGS. 12 and 13 includes a box 68, similar to the box 50, and a two-part base 70, similar to the base 54, supporting a flexible circuit 70a. The box 68 contains two rigidized portions 71, 72 at right angles to each other. There is a portion 73 of flexible cable at one end of the portion 72 and the two portions 71, 72 are connected by a short portion of flexible cable 73a. In the case the spring 70b on the base urges its flexible cable 70a against bared track portions near the left-hand edge of the rigid portion 72. As shown, the rigid portions 71, 72 carry electrical components, which may include a relay, and further connections are made to them via sections of flexible cable 74 with stiffened portions, as shown, which plug in via holes 75 in the box.

It is noted that the bases used both with the transmitter and receiver in FIGS. 8–13 are so formed that removal of the base from the box is quick, and that while making connection therebetween there is a wiping action which facilitates conductor cleaning. The incorporation of the opening in the base simplifies manufacture and assembly.

Figure 14:
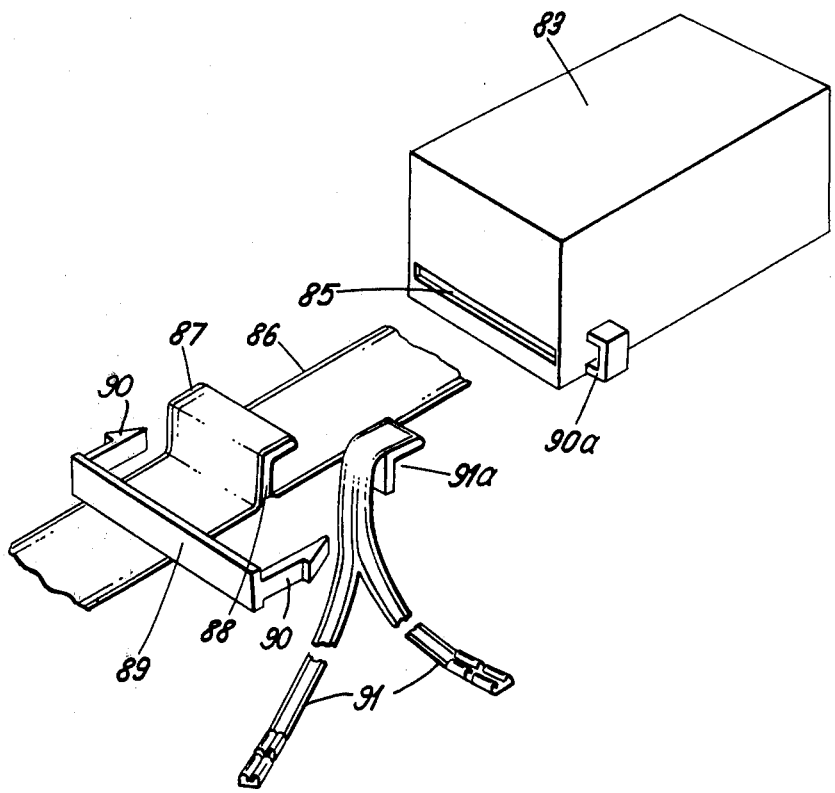
FIG. 14 is a perspective exploded view of a third form of a receiver in accordance with the invention.
Figure 15:
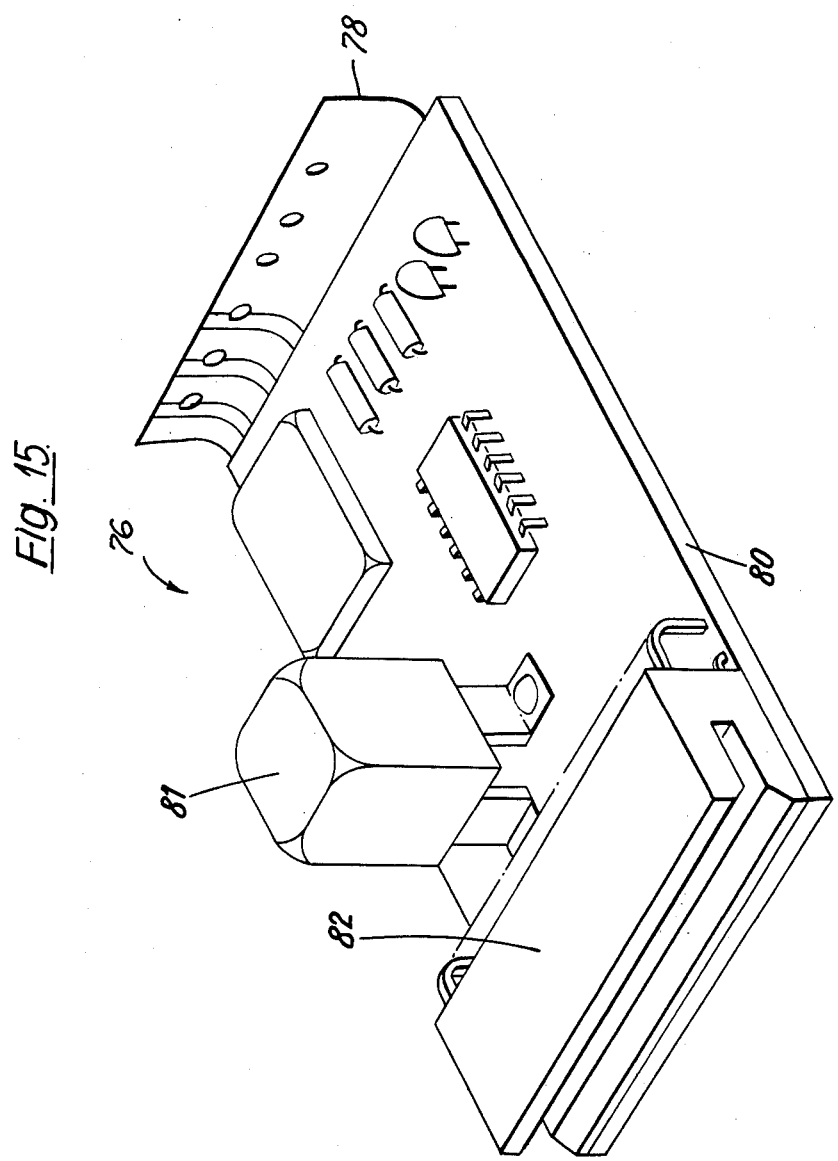
FIG. 15 is a perspective view of the circuit board assembly utilized in the receiver illustrated in FIG. 14.

FIGS. 14 and 15 illustrate another receiver unit. The unit includes the circuit board assembly 76 shown in FIG. 15 comprising a flexible circuit 78 with one rigidized portion 80 which, as shown, carries various electrical components. These include a relay 81 for repeating the signals received from the controlled devices. At one end of the rigidized portion there is a socket connector 82 which, when the flexible circuit is in the box 83, FIG. 14, is aligned with a slot 85 in the side thereof.

The associated system wiring includes a flat cable 86 which passes beneath the box 83 but has a bent-up portion 87 which is wrapped around an inverted L-shaped member 88. This is fitted into the slot 85 and held therein by the U-shaped member 89, whose hooked arms 90 engage with ears 90a on opposite sides of the case 83, only one such ear being visable in FIG. 14. As indicated at 91, two or more flat cables of different sizes carried by a smaller L-shaped member 91a can be fitted into the slot 85 in "plug-like" manner.

Figure 16:
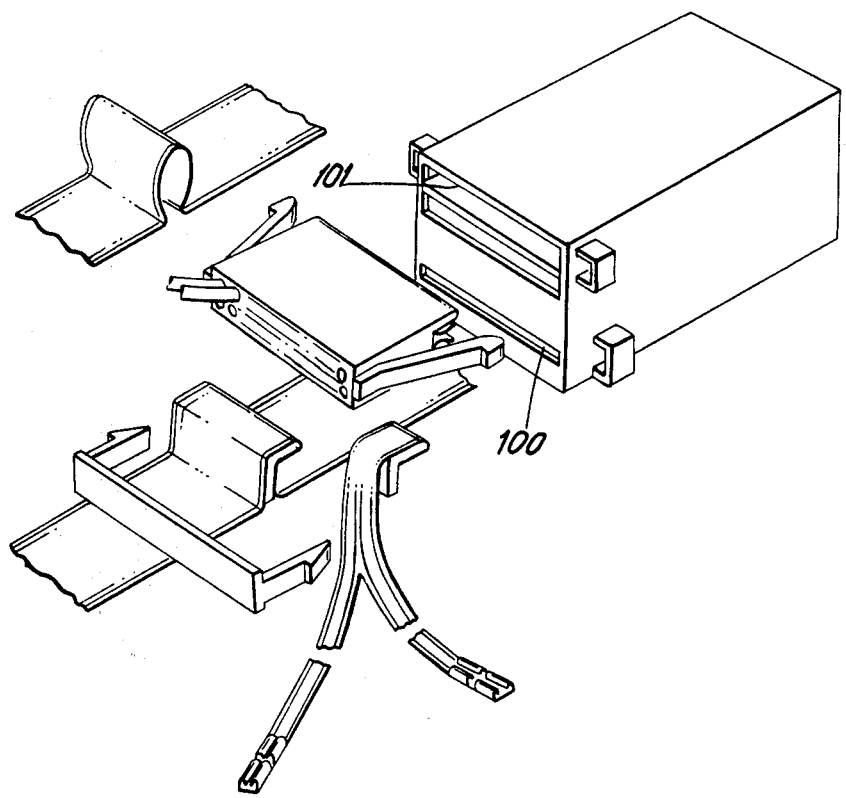
FIG. 16 is an exploded perspective view of a third form of a transmitter according to the invention.
Figure 17:
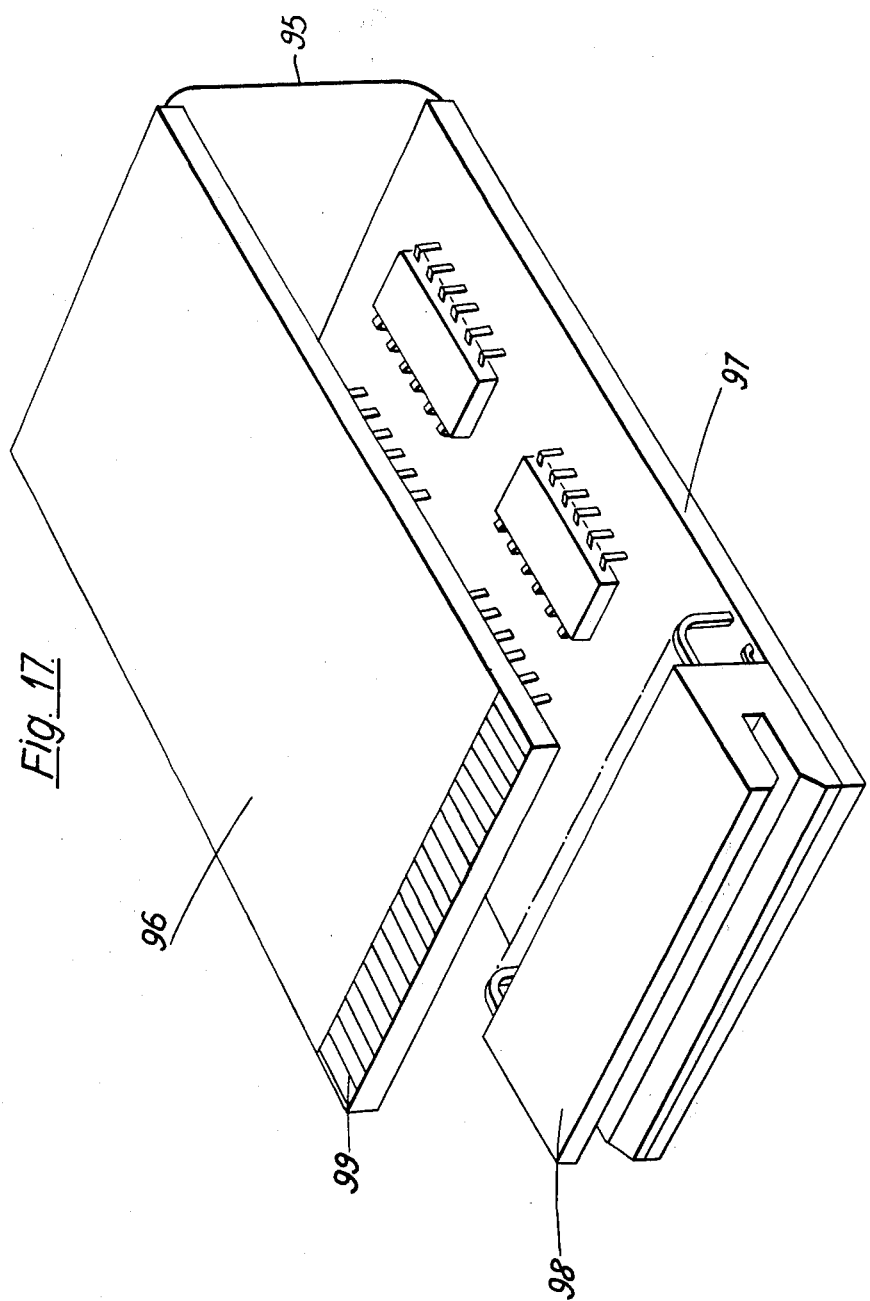
FIG. 17 is an exploded view of the circuit board assembly utilized in the transmitter illustrated in FIG. 16.

The transmitter unit shown in FIGS. 16 and 17 is similar to the unit shown in FIGS. 14 and 15, except that its flexible circuit 95 has two rigidized portions 96, 97, FIG. 17, one of which has a socket connector unit 98 while the other has conductive tracks 99 at its end for use as a male connector element. As can be seen from FIG. 16, these cooperate via slots 100, 101 with male and female connector elements.

It is to be understood that the foregoing description of specific examples of this invention is made by way of example only and is not to be considered as a limitation on its scope.

What is claimed is:
1. An electrical equipment unit comprising:
a box-like case;
a flexible printed circuit having a flexible portion and at least one portion thereof rigidized to provide an integral, planar board-like portion adapted to support electrical components thereon, said flexible circuit having conductive tracks covered by insulation;
means mounting said circuit within said case, said means cooperating with and supporting said board-like portion within said case;
a hole formed in one side of said case;

said flexible portion of said circuit extending across said hole in generally parallel relation to said side;
the insulation on the surface of said flexible portion facing said hole being removed to provide bare conductive tracks thereat;
a connector device removably mounted on said one side of said case over said hole;
means on said connector device for supporting a flexible circuit on the surface of said device overlying said hole; and
spring means in said case urging said flexible portion of said flexible printed circuit outwardly toward said surface of said connector device for electrically engaging said flexible portion to a flexible circuit on said surface.

2. An equipment unit as set forth in claim 1 wherein there are two of said board-like portions formed in said flexible circuit, said mounting means in said case comprising grooves on its inner surface receiving the edges of said board-like portions, a second hole in said case, one edge of one of said board-like portions being located adjacent to said second hole in said case, the insulation being removed from said edge to provide bare conductive tracks thereat so that said edge can act as a male connector element to cooperate with a socket connector element insertable into said second hole.

3. An equipment unit as set forth in claim 1 wherein said flexible circuit has two of said board-like portions with said flexible portion therebetween, said mounting means being a frame-carrier within said case including an end-plate and two parallel plate-like members perpendicular to said end-plate, said end-plate and said plate-like members supporting said board-like portions.

4. An equipment unit as set forth in claim 3 wherein one of said plate-like members has a fork-like portion receiving one end of one of said board-like portions, the other of said plate-like members supporting the other end of said one board-like portion and said end-plate having two parallel closely-spaced rods projecting therefrom parallel to said plate-like members, said other board-like portion being positioned between said rods.

5. An equipment unit as set forth in claim 3 wherein said flexible portion extends substantially parallel to one of said plate-like members, said spring means being located between said flexible portion and said one plate-like member.

6. An equipment unit as set forth in claim 1 wherein said flexible circuit has two of said rigidized board-like portions interconnected by said flexible portion, said mounting means mounting said two board-like portions parallel to each other in said box-like case, a second hold in said case, and one edge of one of said board-like portions being located adjacent to said second hole to act as a male edge connector member, the insulation being removed from said edge to provide bare conductive tracks thereat.

* * * * *

UNITED STATES PATENT OFFICE
CERTIFICATE OF CORRECTION

PATENT NO. : 4,054,353

DATED : October 18, 1977

INVENTOR(S) : L. A. Saunders/R. W. Donnelly

It is certified that error appears in the above-identified patent and that said Letters Patent are hereby corrected as shown below:

On the first page containing the ABSTRACT, first column, after "[73] Assignee:", "International Telephone and Telegraph Industries, New York, N. Y." should read -- ITT Industries, Inc., New York, N. Y.--.

Signed and Sealed this

Eighteenth Day of April 1978

[SEAL]

Attest:

RUTH C. MASON
Attesting Officer

LUTRELLE F. PARKER
Acting Commissioner of Patents and Trademarks